US011602929B2

(12) United States Patent
Scheele et al.

(10) Patent No.: US 11,602,929 B2
(45) Date of Patent: Mar. 14, 2023

(54) PRINTING PLATE SEGMENT MOUNTING SYSTEM AND METHOD

(71) Applicant: Esko-Graphics Imaging GmbH, Itzehoe (DE)

(72) Inventors: Joachim Scheele, Oldendorf (DE); Nils Kay, Oldendorf (DE)

(73) Assignee: Esko-Graphics Imaging GmbH

( * ) Notice: Subject to any disclaimer, the term of this patent is extended or adjusted under 35 U.S.C. 154(b) by 0 days.

(21) Appl. No.: 16/952,709

(22) Filed: Nov. 19, 2020

(65) Prior Publication Data
US 2021/0070037 A1 Mar. 11, 2021

Related U.S. Application Data

(62) Division of application No. 16/111,863, filed on Aug. 24, 2018.

(Continued)

(51) Int. Cl.
*B41F 33/02* (2006.01)
*B41F 27/14* (2006.01)
(Continued)

(52) U.S. Cl.
CPC ........ *B41F 33/0081* (2013.01); *B41F 27/005* (2013.01); *B41F 27/14* (2013.01);
(Continued)

(58) Field of Classification Search
CPC ..................................................... B41F 19/008
(Continued)

(56) References Cited

U.S. PATENT DOCUMENTS 5,333,111 A * 7/1994 Chaiken ................... B26D 5/00
  382/111
5,537,926 A 7/1996 Beisel et al.
(Continued)

FOREIGN PATENT DOCUMENTS

CN  1071368 A  4/1993
CN  1152157 A  6/1997
(Continued)

OTHER PUBLICATIONS

Final Office Action for U.S. Appl. No. 16/111,863, dated May 5, 2021, 13 pages.
(Continued)

*Primary Examiner* — Leslie J Evanisko
(74) *Attorney, Agent, or Firm* — RatnerPrestia

(57) ABSTRACT

A mounting unit, or printing system including a mounting unit, for mounting printing plate segments on a carrier sheet. The mounting unit includes a base for receiving the carrier sheet, at least two cameras, a controller for positioning the cameras relative to the base, and a computer connected to the controller and cameras. The computer is configured to receive a mounting file including a printing plate segment identifier, information regarding alignment of registration marks relative to the carrier sheet; and image data corresponding to a characteristic pattern associated with each printing plate segment. The unit is configured to display a composite image depicting the image data corresponding to the characteristic patterns in a predetermined arrangement of printing plate segment locations and orientations overlaid on an image of the carrier sheet from one of the at least two cameras.

12 Claims, 7 Drawing Sheets

Related U.S. Application Data

(60) Provisional application No. 62/549,638, filed on Aug. 24, 2017.

(51) Int. Cl.
*B41F 33/00* (2006.01)
*H04N 1/387* (2006.01)
*G03F 9/00* (2006.01)
*B41F 33/16* (2006.01)
*B41F 27/00* (2006.01)

(52) U.S. Cl.
CPC .............. *B41F 33/02* (2013.01); *B41F 33/16* (2013.01); *G03F 9/00* (2013.01); *H04N 1/3873* (2013.01); *B41P 2227/30* (2013.01)

(58) Field of Classification Search
USPC ..................................................... 101/382.1
See application file for complete search history.

(56) References Cited

U.S. PATENT DOCUMENTS

| | | | |
|---|---|---|---|
| 5,809,218 A | | 9/1998 | Kastenholz et al. |
| 5,846,691 A | | 12/1998 | Cusdin et al. |
| 5,850,789 A | | 12/1998 | Rudolf et al. |
| 6,121,975 A | | 9/2000 | Mungenast et al. |
| 6,173,211 B1 | * | 1/2001 | Williams ................. A41H 3/08 700/131 |
| 6,257,141 B1 | | 7/2001 | Hashimoto et al. |
| 6,258,495 B1 | * | 7/2001 | Okamura .............. G03F 9/7038 430/22 |
| 6,434,444 B2 | * | 8/2002 | Herman, Jr. ............. B26D 5/00 382/111 |
| 6,954,291 B2 | | 10/2005 | Klein et al. |
| 7,124,687 B2 | | 10/2006 | Wattyn |
| 7,336,912 B2 | | 2/2008 | Yamauchi et al. |
| 8,009,330 B2 | | 8/2011 | Dardikman et al. |
| 8,148,704 B2 | | 4/2012 | Cummings et al. |
| 8,434,406 B2 | | 5/2013 | Gsell et al. |
| 8,910,859 B2 | | 12/2014 | Massicot et al. |
| 9,204,009 B2 | | 12/2015 | Hanawa |
| 9,375,916 B2 | | 6/2016 | Thomas et al. |
| 10,828,917 B2 | | 11/2020 | Scheele et al. |
| 2004/0083862 A1 | | 5/2004 | Mikkelsen et al. |
| 2004/0129157 A1 | * | 7/2004 | Dewitte ................ B41F 27/005 101/382.1 |
| 2004/0187721 A1 | | 9/2004 | Salvestro et al. |
| 2005/0270357 A1 | | 12/2005 | Kawai |
| 2008/0250958 A1 | | 10/2008 | Ruggiero |
| 2008/0250960 A1 | * | 10/2008 | Taylor ................... B41F 27/105 101/479 |
| 2011/0308411 A1 | | 12/2011 | Thomas et al. |
| 2012/0055362 A1 | | 3/2012 | Chretinat et al. |
| 2014/0115886 A1 | | 5/2014 | Sevigny |
| 2014/0326152 A1 | | 11/2014 | Gartner et al. |
| 2016/0042504 A1 | | 2/2016 | Kawabata et al. |

FOREIGN PATENT DOCUMENTS

| | | | | |
|---|---|---|---|---|
| CN | 1625456 A | | 6/2005 | |
| CN | 1872505 A | | 12/2006 | |
| CN | 101380841 A | | 3/2009 | |
| CN | 101646565 A | | 2/2010 | |
| CN | 102001218 A | | 4/2011 | |
| CN | 102248772 A | | 11/2011 | |
| CN | 103098101 A | | 5/2013 | |
| CN | 103955112 A | | 7/2014 | |
| EP | 0348908 A2 | | 1/1990 | |
| EP | 1559520 A2 | | 8/2005 | |
| EP | 2397327 A2 | | 12/2011 | |
| EP | 2428360 A1 | * | 3/2012 | ............ B41F 27/005 |
| EP | 2428360 A1 | | 3/2012 | |
| JP | 2011514545 A | | 5/2011 | |
| WO | 9801792 A1 | | 1/1998 | |
| WO | 2018015500 A1 | | 1/2018 | |

OTHER PUBLICATIONS

International Preliminary Report on Patentability for International Application No. PCT/EP2017/068385, dated Jan. 22, 2019, 10 pages.
International Preliminary Report on Patentability for International Application No. PCT/EP2018/072810, dated Feb. 25, 2020, 10 pages.
International Search Report and Written Opinion for International Application No. PCT/EP2017/068385, dated Nov. 24, 2017, 11 pages.
International Search Report and Written Opinion for international Application No. PCT/EP2018/072310, dated Nov. 6, 2018, 15 pages.
Non Final Office Action for U.S. Appl. No. 16/319,108, dated Apr. 1, 2018, 13 pages.
PlatePatcher 14.0 User Manual, dated Jul. 9, 2014, 48 pages.
PlatePatcher 14.1 User Manual, dated Apr. 28, 2016, 48 pages.
Entire patent prosecution history of U.S. Appl. No. 16/111,863, filed Aug. 24, 2018, entitled, "Printing Plate Segment Mounting System and Method.".
Flexlogic, Fiexo Plate Mounting Machines Corrugated Postprint brochure, Jun. 21, 2016, 6 pages.
Chinese Office Action for Chinese Application No. 201780045083. 8, dated Nov. 3, 2020 with translation, 24 pages.
Chinese Office Action for Chinese Application No. 201880069024. 9, dated Jun. 3, 2021, with translation, 29 pages.
Japanese Notice of Reasons for Refusal for Japanese Application No. 2020-531818, dated Jun. 2, 2022 with translation, 5 pages.
Non Final Office Action for U.S. Appl. No. 17/092,880, dated Dec. 15, 2022, 38 pages.

* cited by examiner

US 11,602,929 B2

PRINTING PLATE SEGMENT MOUNTING SYSTEM AND METHOD

CROSS REFERENCE TO RELATED APPLICATIONS

The present application is a division of U.S. patent application Ser. No. 16/111,863, filed Aug. 24, 2018, which claims priority from U.S. Provisional Application Ser. No. 62/549,638, titled PRINTING PLATE SEGMENT MOUNTING SYSTEM AND METHOD, filed Aug. 24, 2017, incorporated herein by reference in its entirety.

BACKGROUND OF THE INVENTION

In the field of commercial printing, especially printing of packaging, the printed content may cover only a fraction of the media onto which the printing ink is transferred. To minimize printing costs, rather than create a full size printing plate with large areas of empty space, it is known to create smaller printing plate segments and to then place those segments on a carrier sheet. The carrier sheet with attached segments is then used in the printing process of applying ink to the plate segments and transferring ink from the plate segments to the print medium. Images corresponding to each of the printing plate segments can be arranged on a single sheet during the process of imaging, exposing, and finishing the printing plate in an efficient arrangement to minimize empty space, and then the segments separated from one another using a cutting table. Exemplary systems and methods are described in U.S. Pat. No. 6,954,291, titled "Method, apparatus, and computer program for reducing plate material waste in flexography plate making" and assigned to Esko-Graphics A/S, incorporated herein by reference.

For example, image 100 shown in FIG. 1A, represents an exemplary printing layout for a carton, having a plurality of discrete graphic portions, including portions 102, 104, and 106. These portions can be parsed from the larger image 100, and the discrete individual graphic portions 102a, 104a, and 106a rearranged as shown in FIG. 1B in a compressed layout for creating a printing plate. The finished printing plate is then cut into printing plate segments corresponding to each graphic portion. Each segment, such as segment 108 illustrated in FIG. 1C, typically has printed indicia such as mounting number ("S-1") and a job number ("GAELIC GHOST_1605"), and a plurality of (at least two) registration marks 110, all for use in identifying the correct segment and aligning it on the carrier sheet in the proper position.

Various digital mounting units are well known in the art for performing the process of mounting the segments on the carrier sheet in the proper position and orientation, including but not limited to drum and flat machines manufactured by AV Flexologic (e.g. Opti-Mount and Flat FAMM®) such as the machine depicted in FIG. 3B, DuPont (Cyrel® Macroflex machines), Bieffebi S.p.A., and J M Heaford. These exemplary digital mounting machines are supported by software, such as PlatePatcher™ software manufactured by Esko Software BVBA. PlatePatcher software includes instructions for programming a computer to allow a user to designate each portion of the original image to be created as a discrete plate segment, organize the segments into a compressed printing plate layout for printing, instruct a cutting machine for cutting the segments from the completed plate, and instruct a mounting unit to facilitate placement of the cut segments onto a carrier sheet.

The graphical user interface (GUI) of each mounter is unique, and users of such machines may find it difficult to identify the corresponding patch that needs to be mounted during the workflow. Displays associated with prior art mounting systems show the user only a table with the coordinates used by the mounter for moving the carrier sheet into the proper location for mounting the segments, and the mounting or index number for the segment to be placed in that location. Some mounters also display a coarse overview related to the position of the segments.

An exemplary prior art GUI is illustrated in FIG. 2, showing in the leftmost screen rectangular boxes 14 labeled with each plate segment number (e.g. 2.1000), and in the rightmost screen a table of rows 15. Each row corresponds to one of the printing plate segments, and contains information regarding the X and Y coordinates corresponding to the location on the carrier sheet where each plate segment is to be placed, and the width of that segment (i.e. spacing between the registration marks). The GUI has various virtual buttons 12, 13, 17, 18 for giving commands to the mounting unit or mounting software. In use, the software steps through the segments in a numerical order (e.g. Group 1, 2, 3 in column 16) until all segments have been placed.

An exemplary rotary mounting system 300, illustrated in FIG. 3A, may comprise a drum 301 on which carrier sheet 302 is mounted, a pair of cameras 304, 306 directed to the surface of the drum/carrier sheet, and at least one display 308 for visualizing side-by-side composite images 310, 311 comprising images captured by the cameras overlaid with alignment indicia. The user thus aligns the cross-shaped registration marks with the cross-shaped alignment indicia for proper placement of the printing plate segments. A controller 320 controls movement of the drum and the cameras using mechanisms well known in the art, and a computer processor 548 is connected to the controller 320 and the display 308, for providing instructions to the controller and the display.

In use, the coordinates for mounting each segment are input to the mounting unit processor, which instructs the controller to position the drum/carrier sheet and cameras in locations corresponding to the coordinates in position to receive the plate segment, and a user selects the appropriate printing plate segment, typically applies two-sided tape or some other adhesive to the back of it, and aligns it relative to the carrier sheet under the cameras until such time that the registration marks on the plate segment align with the alignment indicia on the display. When the alignment is completed, the segment is affixed to the carrier sheet, and the workflow progresses to the next segment until all of the segments have been placed.

A flat or table mounting machine, such as is illustrated in FIG. 3B, has similar features similarly numbered and is operated in a similar manner as a rotary mounting machine, except the carrier sheet is disposed flat on a table 330 rather than on a drum, and therefore the controller 320 may operate a carriage 340 along a first axis relative to the table, and the cameras may be configured to move along a second axis on the carriage (typically perpendicular to the first axis) relative to one another, to enable positioning of the cameras above the X, Y coordinates corresponding to plate segment locations. Of course, the relative motion between the table (or any movable carrier-sheet mounting base portion of the table) and the cameras in one axis may also be accomplished via movement of the table relative to cameras disposed on a fixed bar positioned over the table or the movable portion of the table configured for mounting the carrier sheet.

In the prior art embodiments described above, to find the corresponding printing plate segment, the user must find the job name (e.g. "GAELIC GHOST_1605") and the segment index or mounting number (e.g. "S-1") on the plate segment. The user must then properly align the segment underneath the cameras to affix the segment to the carrier sheet in the proper location and orientation. Because the polymer plate segments are typically transparent, it is often difficult to read the text on the plate segments. Thus, there is a need in the field for making the process of mounting plate segments on a mounting unit easier.

SUMMARY OF THE INVENTION

One aspect of the invention comprises a computer-implemented method for mounting one or more printing plate segments on a carrier sheet in a predetermined arrangement of one or more printing plate segment locations and orientations. Each printing plate segment has a printing plate segment identifier, at least two registration marks spaced a distance apart from one another, and a characteristic pattern configured to print on a medium using the printing plate segment. The method comprises importing a file into a computer associated with a mounting unit for mounting the one or more printing plate segments on the carrier sheet. The file includes computer-readable information comprising, for each printing plate segment: (a) the printing plate segment identifier, (b) information regarding alignment of the two registration marks relative to the carrier sheet; and (c) image data corresponding to the characteristic pattern associated with each printing plate segment. Then, a display connected to the computer displays a composite image depicting the image data corresponding to the characteristic patterns associated with the one or more printing plate segments in the predetermined arrangement of one or more printing plate segment locations and orientations.

In one embodiment, the computer identifies a printing plate segment to be mounted and instructs the mounting unit to assume a configuration for receiving the printing plate segment on the carrier sheet. The printing plate segment is then placed on the carrier sheet in its predetermined location and orientation, and repeats the foregoing steps for one or more additional plate segments.

Another aspect of the invention comprises a mounting unit for mounting one or more printing plate segments on a carrier sheet in a predetermined arrangement of one or more printing plate segment locations and orientations. The mounting unit comprises a base, such as a drum or a table, for receiving the carrier sheet, at least two cameras, a controller for positioning the at least two cameras relative to the base in accordance with a set of programmable coordinates, a computer connected to the controller and the at least two cameras, and at least one display connected to the computer. The computer has at least a computer memory and a computer processor, and is configured to receive a mounting file comprising computer-readable information comprising, for each printing plate segment: (i) the printing plate segment identifier, (ii) information regarding alignment of the two registration marks relative to the carrier sheet; and (iii) image data corresponding to the characteristic pattern associated with each printing plate segment. The computer programmed with instructions for carrying out the steps of reading the mounting file, displaying on the at least one display a composite image depicting the image data corresponding to each characteristic pattern associated with the one or more printing plate segments in the predetermined arrangement of one or more printing plate segment locations and orientations, and instructing the positioning mechanism to position the cameras relative to the base at respective programmable coordinates corresponding to each printing plate segment location and orientation in a stepwise manner until each of the one or more printing plate segments has been placed at its corresponding location in its corresponding orientation.

Yet another aspect of the invention comprises a computer readable medium carrying computer readable code segments to instruct one or more processors of a processing system to carry out a method for mounting one or more printing plate segments on a carrier sheet in a predetermined printing arrangement of one or more printing plate segment locations and orientations. The computer-readable medium comprises one or more code segments for instructing the one or more processors to create a file comprising computer-readable information comprising, for each printing plate segment: (a) the printing plate segment identifier, (b) information regarding alignment of the two registration marks relative to the carrier sheet; and (c) image data corresponding to the characteristic pattern associated with each printing plate segment. The medium also comprises one or more code segments for instructing the one or more processors to cause a display connected to the computer to display a composite image depicting the image data corresponding to the characteristic patterns associated with each of the one or more printing plate segments in the predetermined printing arrangement of one or more printing plate segment locations and orientations.

In some embodiments, the medium may further comprise one or more code segments for reading and displaying a single image file having image portions corresponding to the predetermined printing arrangement of one or more printing plate segment locations and orientations, parsing the single image file into one or more image subfiles. Each subfile corresponds to one printing plate segment. In such an embodiment, the medium also comprises one or more code segments for arranging the one or more image subfiles into a printing plate composite layout for creating a singular printing plate for dividing into the one or more printing plate segments. The printing plate composite layout comprises at least one relative location or orientation of at least one printing plate segment that is different from the relative location or orientation of the at least one printing plate segment in the predetermined arrangement of one or more printing plate segment locations and orientations. The medium in this embodiment also comprises one or more code segments for creating a file readable by a cutting machine for cutting the singular printing plate having the printing plate composite layout into the one or more printing plate segments.

Yet another aspect of the invention comprises a printing system for printing an image having one or more image portions arranged in a predetermined arrangement of one or more image portion locations and orientations. The printing system comprises a layout computer processor, a cutting machine, and a mounting unit for mounting the one or more printing plate segments on a carrier sheet.

The layout computer processor is programmed with instructions for reading and displaying a single image file comprising the one or more image portions arranged in the predetermined arrangement of one or more image portion locations and orientations, and parsing the single image file into one or more image subfiles corresponding to one or more printing plate segments. Each subfile corresponds to one image portion. The layout computer processor is further programmed with instructions for adding indicia, including a printing plate segment identifier and at least two registration marks, to each image subfile, and rearranging the one or more image subfiles into a printing plate composite layout.

The printing plate composite layout includes at least one location or orientation of at least one image portion that is different from the location or orientation of the at least one image portion in the predetermined arrangement of one or more image portion locations and orientations. The layout computer processor is further programmed with instructions for creating a cut file readable by a cutting machine. The cut file comprises information readable by a processor associated with the cutting machine to identify a location of each printing plate segment on a printing plate and cut along a path operable to separate each of printing plate segment from a remainder of the printing plate. The layout computer processor is further programmed with instructions for creating a mounting file readable by a mounting machine. The mounting file includes information readable by a processor associated with the mounting machine, the information comprising for each printing plate segment: (i) the segment identifier, (ii) information regarding alignment of the two registration marks relative to the carrier sheet; and (iii) image data corresponding to the image portion and to a characteristic pattern associated with the printing plate segment.

The cutting machine in the foregoing system is connected to a cutting machine computer processor that is programmed with instructions to read the cut file and translate information in the cut file into instructions for commanding the cutting machine to cut the one or more printing plate segments from a printing plate having the printing plate composite layout.

The mounting unit of the foregoing system is configured for mounting the one or more printing plate segments on the carrier sheet in a predetermined arrangement of one or more printing plate segment locations and orientations corresponding to the predetermined arrangement of one or more image portion locations and orientations. The mounting unit includes a base for receiving the carrier sheet, at least two cameras, a controller for positioning the at least two cameras relative to the base in accordance with a set of programmable coordinates, a mounting machine computer processor connected to the controller and the at least two cameras and configured to receive the mounting file, and at least one display connected to the computer. The mounting machine computer processor is programmed with instructions for carrying out the steps of reading the mounting file, displaying on the at least one display a composite image depicting the image data corresponding to the characteristic pattern associated with each plate segment in the predetermined arrangement of one or more printing plate segment locations and orientations, and instructing the positioning mechanism to position the cameras relative to the base at respective programmable coordinates corresponding to each printing plate segment location and orientation in a stepwise manner until each of the one or more printing plate segments has been placed at its corresponding location in its corresponding orientation.

DETAILED DESCRIPTION OF THE INVENTION

Figure 2:
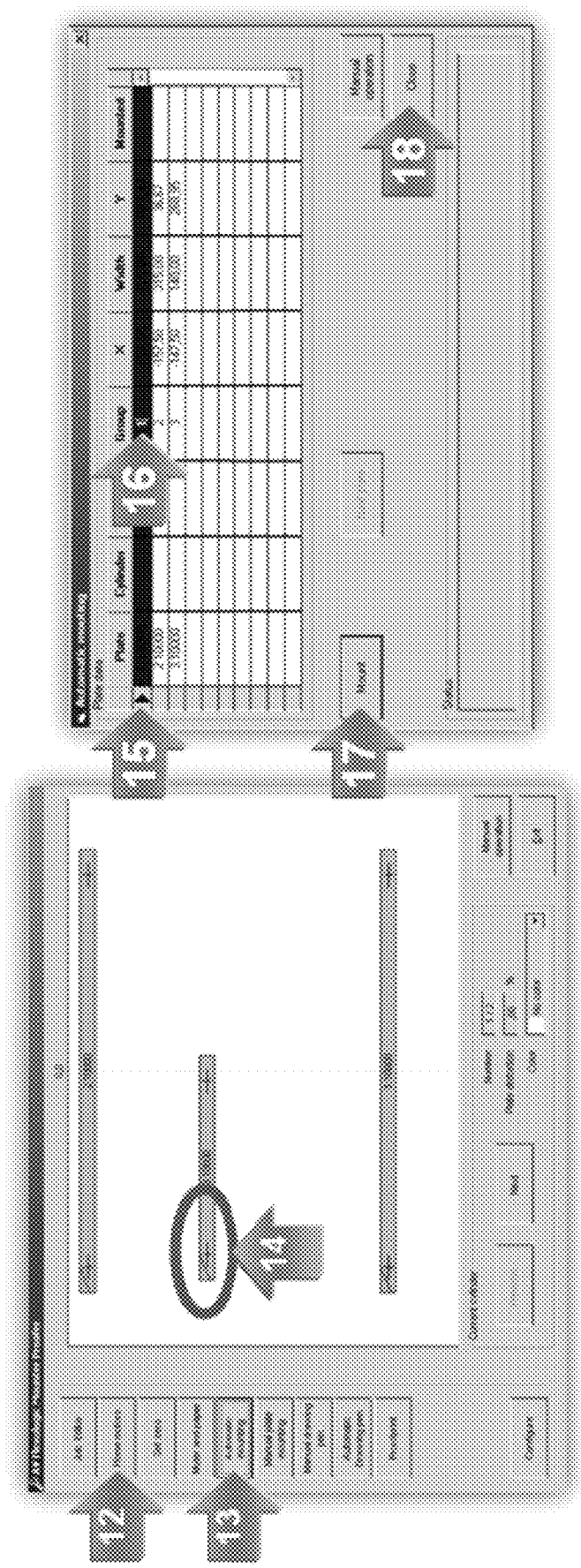
FIG. 2 depicts an exemplary prior art user interface display associated with a plate segment mounting unit.
Figure 4:
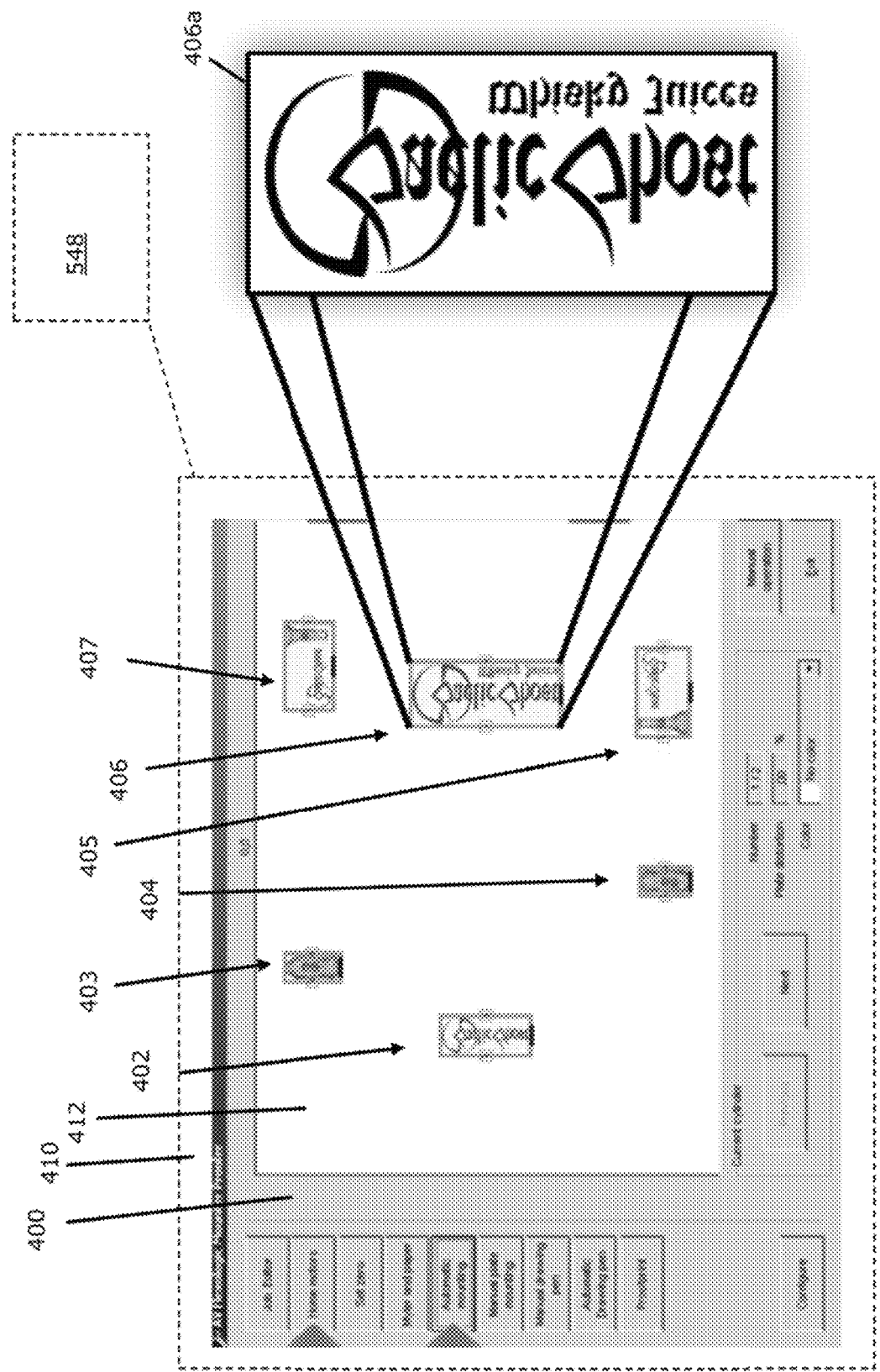
FIG. 4 depicts an exemplary graphical user interface (GUI) display in accordance with an embodiment of the invention.

Referring now to FIG. 4, an exemplary graphical user interface (GUI) corresponding to one embodiment of the invention is shown. Instead of showing only a table with some coordinates and a rough overview on the plate as depicted in FIG. 2, GUI 400 displayed on display 410 associated with a processor 548 connected to a mounting unit, depicts images corresponding to each plate segment 402, 403, 404, 405, 406, 407 in a composite image 412. The images for each plate segment include at least the characteristic pattern associated with the printing plate segment (e.g. image 406 corresponds to plate segment 406a). The "characteristic pattern" as referred to herein, refers to the combination of ink-receptive and non-ink-receptive portions of the plate segment that, when printed on a medium, resolve to an image comprising text, graphics, or a combination thereof. Each composite image also may include indicia, such as at least the registration marks, to help the user locate the registration marks on the plate segment relative to the characteristic pattern. Each image is also oriented and located relative to one another in a position on the screen corresponding to its intended relative location on the carrier sheet. This display decreases the chance for incorrect mounting, such as by using the wrong segment or mounting the segment 180° rotated. Although described herein with reference to examples with multiple images corresponding to multiple plate segments, it should be understood that aspects of the invention are beneficial for applications with only a single image and single plate segment as well, as the proper orientation of even a single plate segment may be assisted. Thus, any of the foregoing and following examples apply to any application with one or more plate segments and one or more images.

The mounting file imported to the mounting machine in connection with the present invention thus includes not only coordinates and other textual information corresponding to the location and labeling of each segment, but also image files corresponding to each segment. Ideally, software, such as ESKO® PlatePatcher™ software, already contains the image information from creating the plate segments and therefore can readily include that image information in the file shared with the processor associated with the mounting unit for display during mounting. The shared information may be in the form of an output file transmitted to the computer associated with the mounting unit. That output file may be password protected.

Figure 3A:
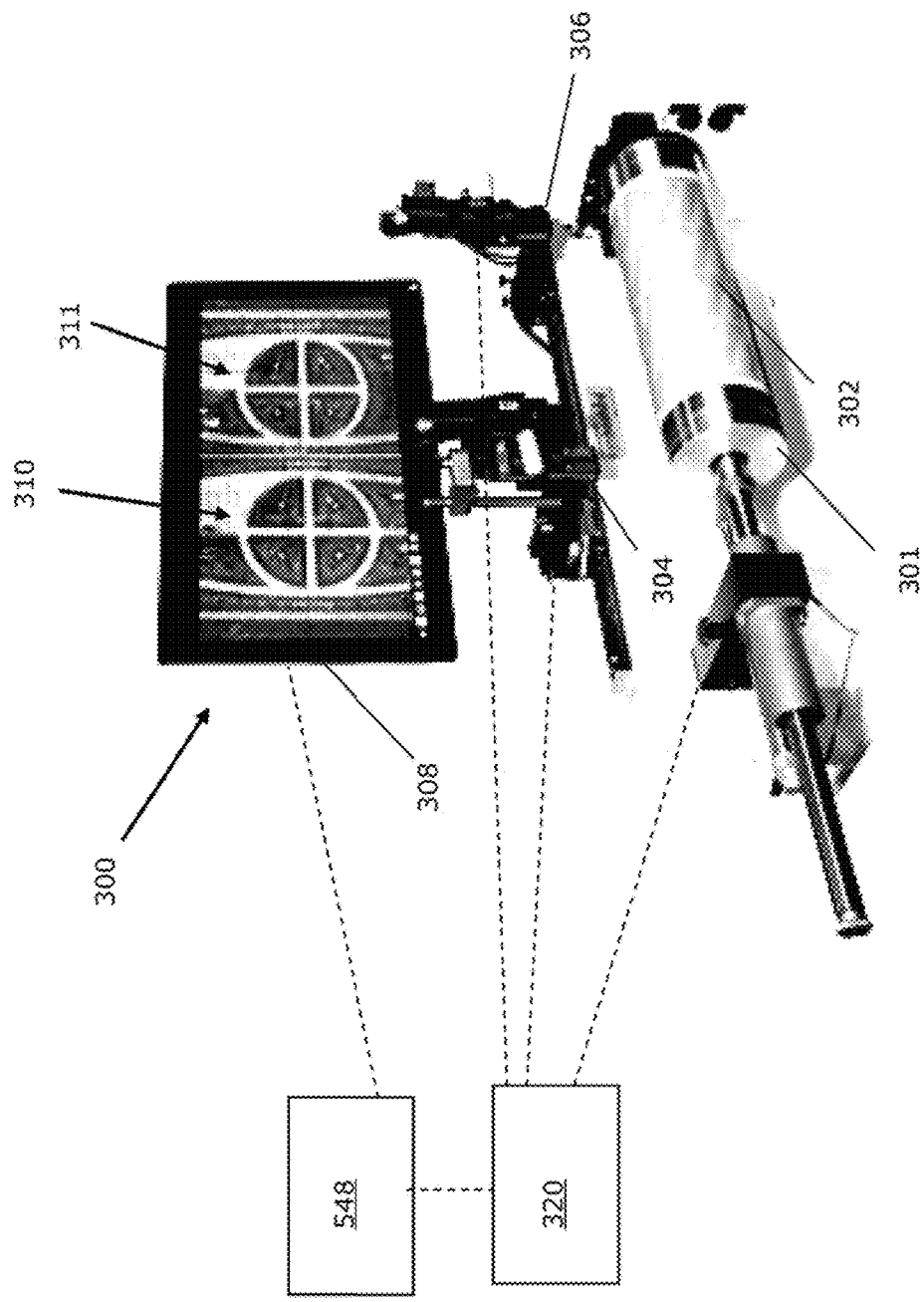
FIG. 3A depicts an exemplary rotary plate mounting unit.
Figure 3B:
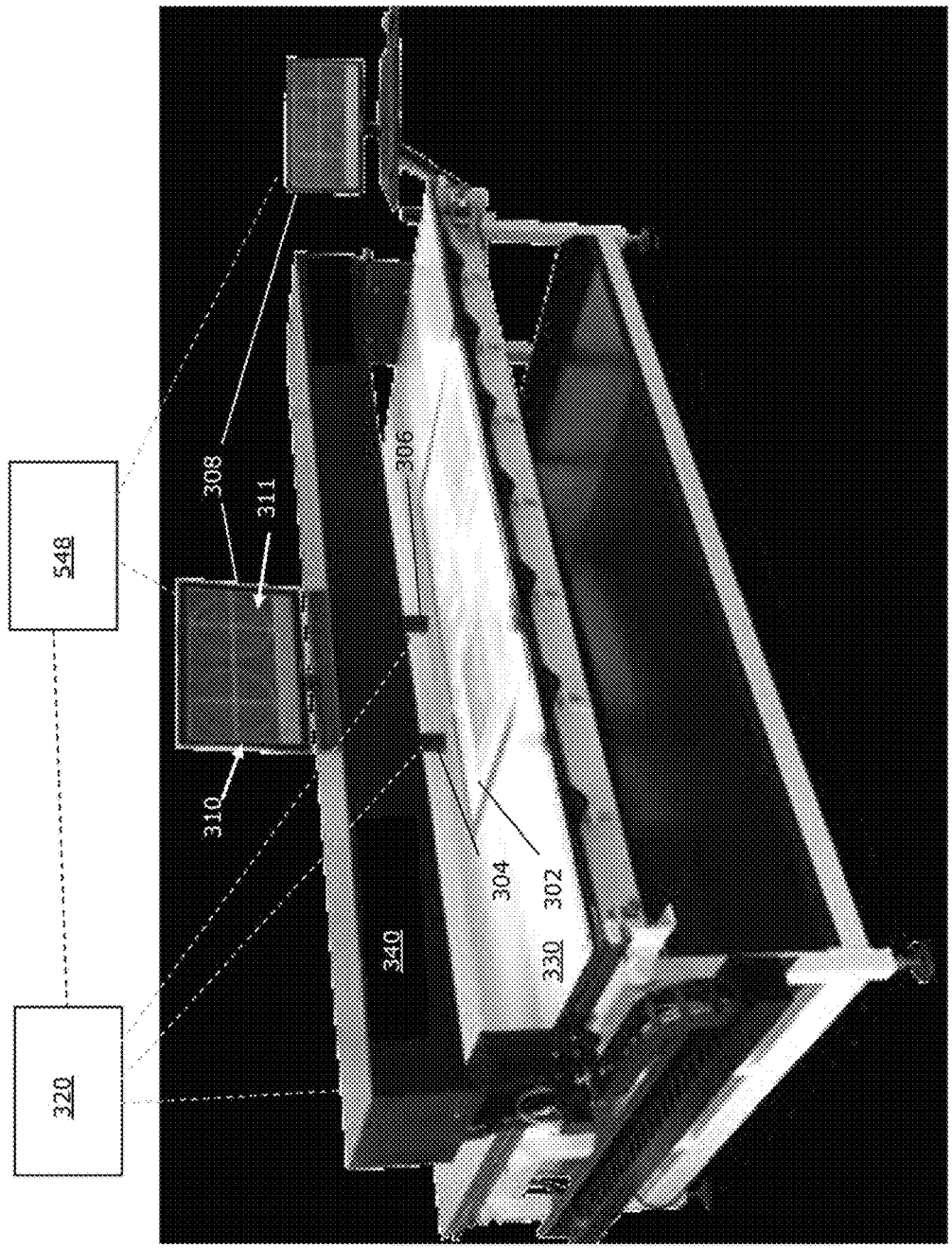
FIG. 3B depicts an exemplary flat plate mounting unit.
Figure 5:
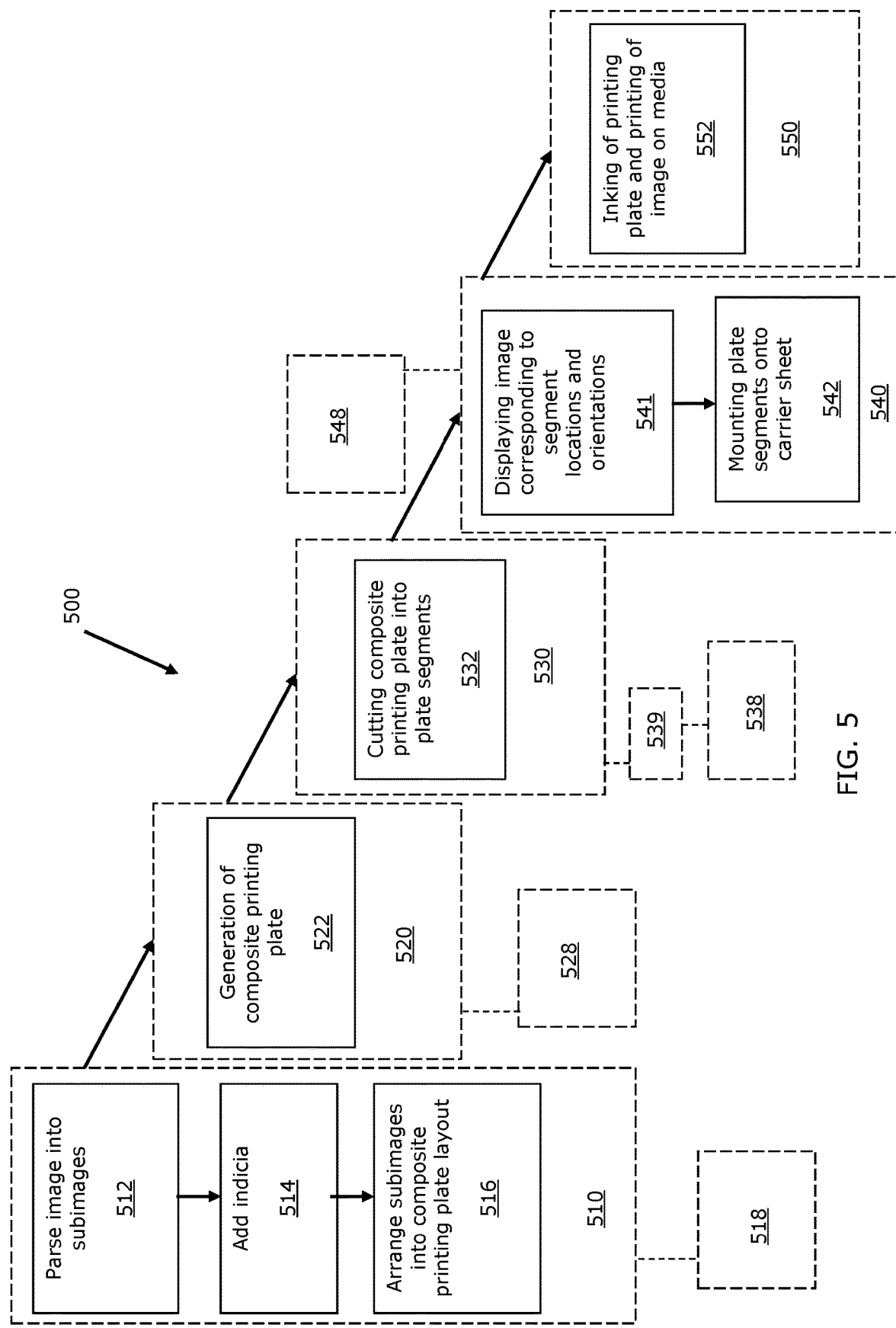
FIG. 5 is a schematic illustration of an exemplary printing workflow.

Thus, one aspect of the invention comprises a mounting machine such as machines 300 and 350 illustrated in FIGS. 3A and 3B. As discussed above, mounting unit 300 or 350 may be used for mounting a plurality of printing plate segments on a carrier sheet 302 in a predetermined arrangement of segment locations and orientations, such as at locations and orientations corresponding to those found in image 100 depicted in FIG. 1A. Mounting machine 300 or 350 may be used during a mounting step 542 in a mounting portion 540 of a printing workflow 500, depicted in FIG. 5. Exemplary workflow 500 is explained in more detail below.

Image 100 comprises a plurality of image portions, and the same software that has a module for creating the input file for the mounting unit may also have a module for parsing image 100 into individual image portions that correspond to the printing plate segments discussed herein. For example, image 100 may be displayed on a portion of a computer display 150 that is connected to a computer processor 518 in a layout portion 510 of the printing workflow. As used herein throughout the application, the term "connected" may refer to a wired or a wireless connection and to a direct (e.g. a wire connected to an output port of a computer to an input port on a computer display, or a wireless connection via Bluetooth® technology) or an indirect connection (e.g. a wireless connection over a computer network, in which one or more intermediate components may be disposed between the processor and the display; a wired connection from an output port to a switch and then wired from the switch to the display), or some combination thereof. Also, as used herein, the term "computer processor" may refer to a single processor or a plurality of processors, which plurality of processors may be linked together in a single machine, system of machines, or network, or may be discrete processors that may or may not have the capability of communicating with one another directly. Where information generated by one processor is shared with another processor, the information may be shared over a wired or wireless network, or combination thereof, or via any computer readable media, such as computer discs, flash drives, hard drives, and the like, without limitation.

Figures 1A, 1B:
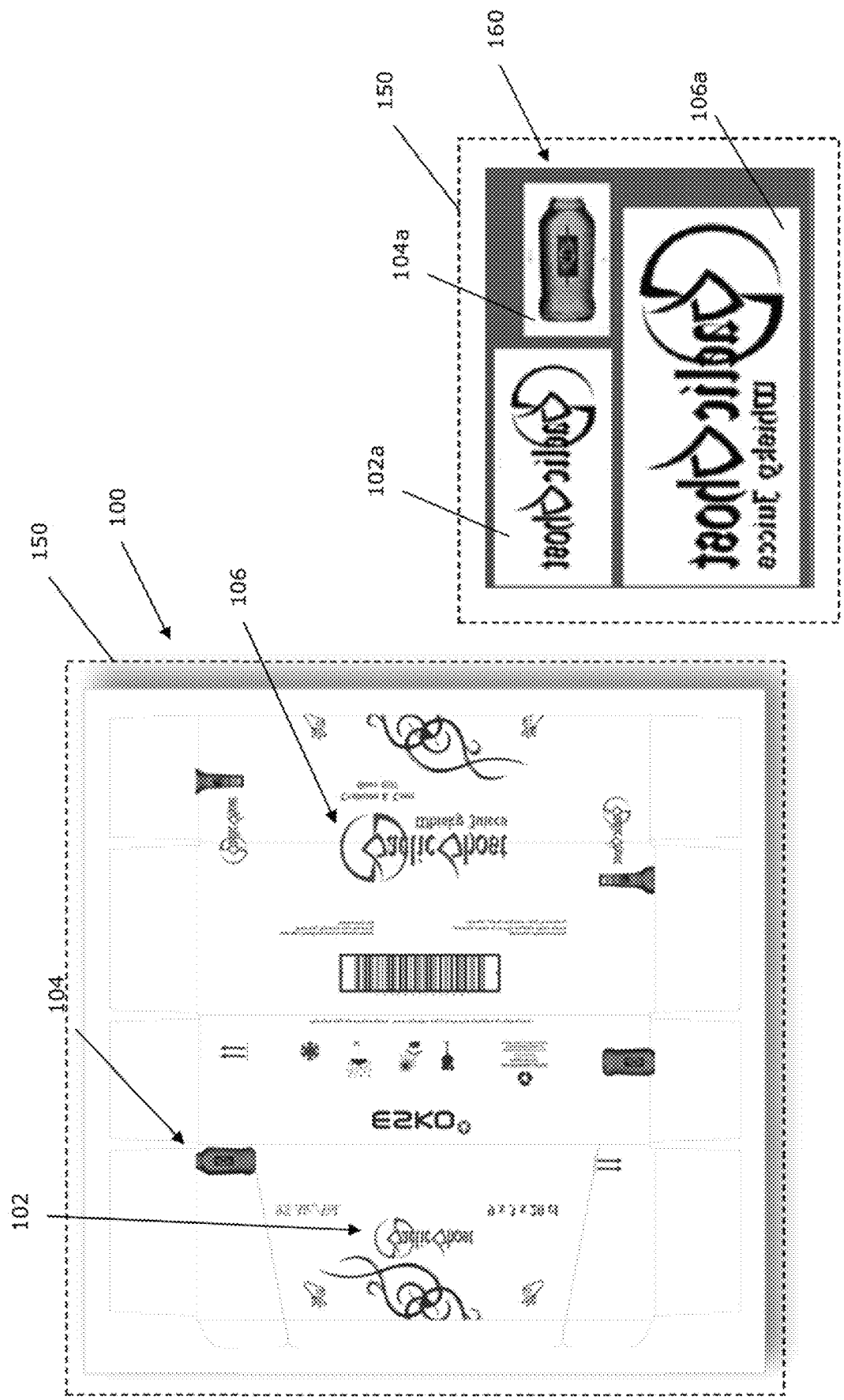
FIG. 1A depicts an exemplary image corresponding to a printed object.
FIG. 1B depicts exemplary image portions parsed from the image of FIG. 1A and rearranged for creating a composite printing plate.

The computer processor connected to display 150 may be programmed with instructions for reading and displaying a single image file corresponding to image 100, which comprises a plurality of image portions (e.g. 102, 104, 106) arranged in the arrangement of image portion locations and orientations depicted in FIG. 1A. Each image portion corresponds to one of a plurality of printing plate segments, created as explained in more detail below.

Figure 1C:
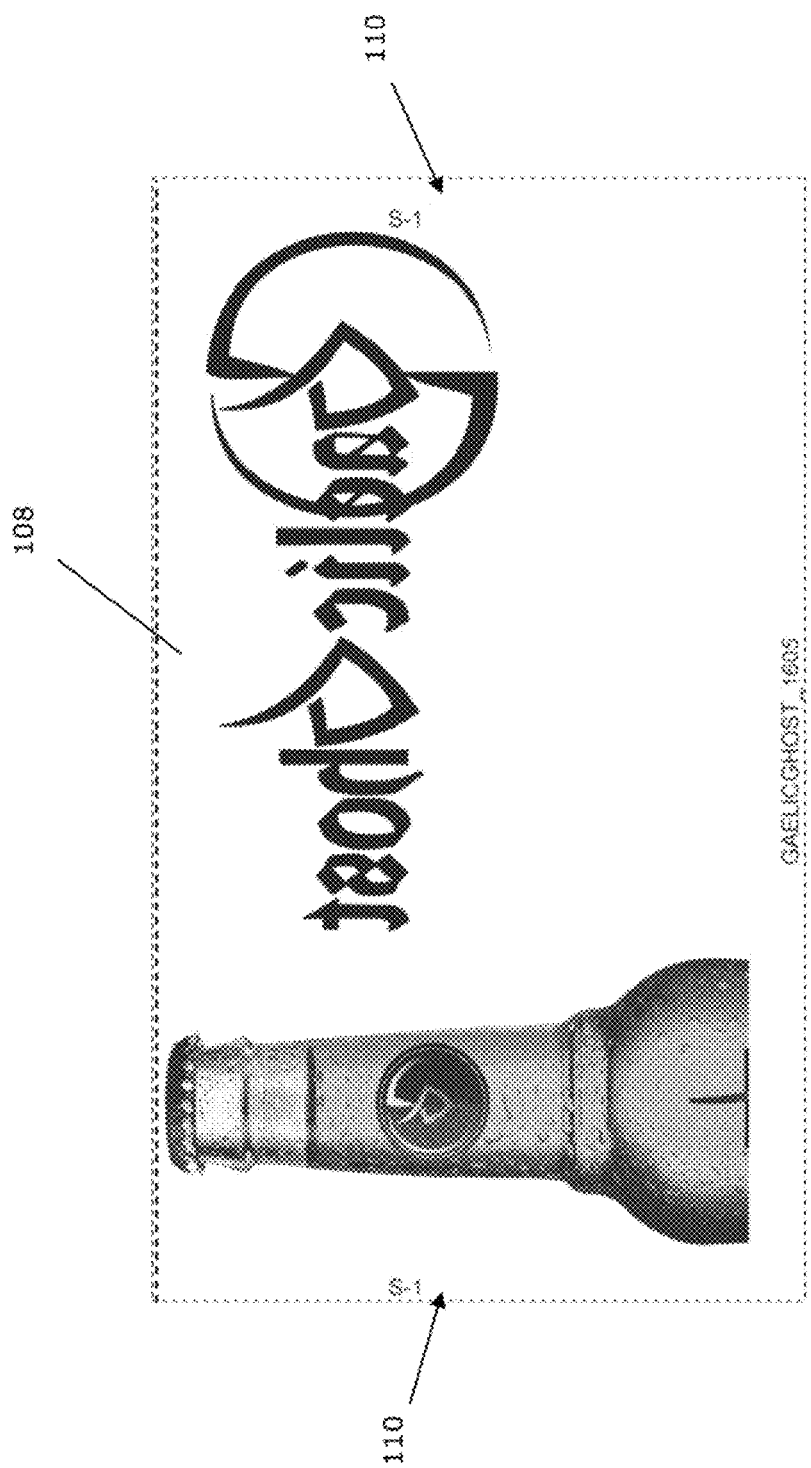
FIG. 1C depicts an exemplary printing plate segment corresponding to an image portion of the exemplary image of FIG. 1A.

A user of the relevant software module (e.g. computer-readable instructions in the nature of code segments residing on computer-readable media) may then, in step 512 of the workflow, parse the single image file 100 into a plurality of image subfiles, such as the subfiles 102a, 104a, and 106a depicted in FIG. 1B, each subfile corresponding to the respective image portion (102, 104, 106). For an embodiment with only a single image and single printing plate segment, no parsing step is needed (although, if necessary or desirable, in some cases, image content corresponding to the single image may be parsed from blank areas around the image). In step 514 of the workflow, the software, automatically and/or with user interaction, may then also add indicia, including the printing plate segment identifier (e.g. "S-1" in segment 108 depicted in FIG. 1C), a printing job title (e.g. "GAELICGHOST_1605") and a plurality of registration marks 110, to each image subfile. Unlike the graphics of the bottle and stylized "Gaelic Ghost" lettering shown in FIG. 1C, which define the characteristic pattern configured to print on a medium using the printing plate segment to be created from the image subfile, the various indicia (segment identifier, job title, and registration marks) are ultimately printed on the printing plate segment in a manner visible to a handler of the printing plate segment, but not converted to a pattern of ink-receptive and non-in-receptive areas that visibly print on the medium when printing with the printing plate segment.

In step 516 of the workflow, the software may than, automatically and/or with user interaction, rearrange the image subfiles into a printing plate composite layout, such as layout 160 depicted in FIG. 1B. Layout 160 may be displayed on display 150. In layout 160, the location and orientation of each of images 102a, 104a, and 106a rendered by the processor on the display are different than the locations and orientations of image portions 102, 104 and 106 in image 100. It should be understood, however, that some image portions in the printing plate composite layout may have at least the same orientation (and in rare instances a similar relative location) as their corresponding images in the predetermined arrangement of image portion locations and orientations. In general layout 160 is an efficient layout that minimizes empty space between image subfiles, so long as the space is sufficiently large to provide a border around each printing plate segment to permit cutting that segment away from surrounding segments in the appropriate step.

In step 522 of the workflow, a layout file—an image file comprising instructions corresponding to layout 160—may then be used by a computer processor 528 associated with a plate-making portion 520 of workflow 500 to create a printing plate having that layout. Thus, for example, processor 528 may be part of an imagesetter that uses the image file corresponding to layout 160 to fix an image of the layout onto a printing plate substrate using any one of various technologies known in the art, and that imaged printing plate substrate may be subsequently processed via any of various processes known in the art for creating a printing plate. The technology as described herein may be particularly well adapted for flexographic printing, however.

In step 532 of the workflow, the printing plate may then move into a cutting portion 530 of workflow 500. A cut file, typically created during the layout portion 510 of the workflow using the layout processor 518, contains information corresponding to layout 160 used by a computer processor 538 associated with a cutting machine (not shown). Processor 538 may be programmed with instructions to cause the cutting machine to cut the printing plate having layout 160 into a plurality of printing plate segments, such as segment 108 depicted in FIG. 1C. The coordinates of the registration marks, for example, may be used by the cutting machine, such as using machine vision, to locate each printing plate segment to be cut in accordance with a cutting path defined in the cut file and read by the processor for the cutting machine into movements of the corresponding cutting head.

The discrete printing plate segments are then transferred into a mounting portion 540 of workflow 500. During the layout portion 510 of workflow 500, processor 518 may generate a mounting file used by processor 548 during the step of mounting the plate segments onto a carrier sheet. The mounting file comprises computer-readable information comprising, for each printing plate segment: (i) the segment identifier, (ii) information regarding alignment of the registration marks relative to the carrier sheet; and (iii) the image subfile corresponding to the printing plate segment. The information regarding alignment of the registration marks relative to the carrier sheet may comprise coordinates for aligning a first registration mark on the carrier sheet, and information identifying the location for aligning the second registration mark of the segment on the carrier sheet. The information identifying the location for aligning the second registration mark may be provided, for example, in the form of a width or distance between the registration marks, from which the location of the second coordinate may be calculated from the known location of the first registration mark. Thus, three data points may be all that are required to uniquely identify the segment location: (a) the X coordinate of the first registration mark, (b) the Y coordinate of the first registration mark, and (c) distance (along a known fixed axis) between the first and second registration marks. The foregoing information in the mounting file is then used by processor 548 during the mounting process to generate image 412 to be displayed on display 410 connected to processor 548, to facilitate placement and selection of each printing plate segment during the mounting process.

As described with respect to FIGS. 3A and 3B, the mounting unit comprises a base, such as a drum 301 in a rotary mounting machine or a table 330 in a flat mounting machine, for receiving carrier sheet 302, at least two cameras 304 and 306, and a controller 320 connected to the cameras and/or to any movable carriage on which the cameras are mounted and/or to any movable base on which the carrier sheet is mounted, for positioning the cameras relative to the drum 301 or table 330. Processor 548, thus reads the mounting file, and displays image 412 as part of the GUI 400 on display 410. Image 412 is essentially a composite image depicting the image data corresponding to the characteristic patterns associated with the plurality of plate segments, arranged in the predetermined arrangement of segment locations and orientations in which they are to be mounted on the carrier sheet. Thus the same three points of information noted above to define the unique mounting location, in combination with the image information, provide instructions to the processor 548 for rendering composite image 412 on display 410. Display 410 may be the same display as display 308 depicted in FIGS. 3A and 3B, and the processor may be configured to toggle back and forth between the GUI 400 and image 412 for selecting the plate segment to be placed, and the side-by-side composite images 310, 311 of alignment indicia overlaid with registration marks captured by the camera. In other embodiments, the mounting machine processor may have a first display for displaying the GUI and a second, dedicated display for displaying the images captured by the camera overlaid with the alignment indicia.

The software automatically, or the user manually, moves stepwise through the plate segments to be placed on the carrier sheet using the user interface. The user interface may comprise a screen with a number of virtual buttons, as shown in FIG. 4, and a user-controlled component for selecting and activating each button, such as a mouse, joystick, keyboard, or the like, or the user's finger in embodiments in which a touchscreen permits selection and pressing of buttons by placing a finger or stylus adjacent the surface of the display screen in the vicinity of the pixels corresponding to each button or active area programmed in the interface for interactivity with the user. As each printing plate segment is selected, the processor reads the coordinates corresponding to that segment from the file, and sends commands to the controller 320, which controls positioning mechanisms associated with the cameras 304, 306 and the drum 301 to move the cameras and the drum into a position for receiving the printing plate segment on the carrier sheet 302 in its predetermined location and orientation. In a table embodiment, the controller may control a carriage 340 movable relative to the table 330 (or table or portion thereof movable relative to a fixed overhead camera mounting platform) and cameras 304, 306 movable relative to one another mounted on the carriage 340 (or mounting platform) to provide the correct positioning. Thus, as referred to herein, steps that comprise positioning the cameras relative to the base on which the carrier sheet is mounted, may involve (a) movement of the cameras relative to one another, (b) movement of the base (drum or movable table or portion thereof) or movement of a movable camera mounting platform (carriage) relative to the base, or a combination of (a) and (b).

In manual embodiments, the user then selects the appropriate printing plate segment for mounting, and aligns the registration marks of the segment underneath the cameras and adjusts the position of segment relative to the carrier sheet until the registration marks align with the alignment indicia in the side-by-side images displayed on the display 308. When the alignment indicia and registration marks are aligned, the segment can then be secured to the carrier sheet by any means known in the art.

Typically, the carrier sheet is mounted on the mounting machine and the plate segments are glued with double sided tape onto the carrier sheet, especially for applications in the corrugated market, which is characterized by the use of thick plates and, optionally, Esko® PlatePatcher software. The invention is not limited to use in any particular market or with any particular software, however, and use in the flexible market and in association with other software (e.g. Esko® Grapholas® Merger™ functionality). In other embodiments, such as flexo embodiments, the drum may be a vacuum drum (or the table a vacuum table) and the sheet may have perforations that permit sufficient vacuum to penetrate the carrier sheet to hold the printing plate segment in place. In still other embodiments, the carrier sheet may be a magnetic or metal sheet and the printing plate segment may comprise a material (magnetic for a metal carrier, or metal for a magnetic carrier) selected to be held in place by a magnetic force. Some systems use a combination of adhesive, vacuum, and/or magnetic affixation mechanisms.

A machine vision algorithm used by the computer processor may assist the user in determining when the proper alignment has been achieved. The mounting process proceeds in a stepwise manner until each of the plurality of segments has been placed at its intended location in its intended orientation on the carrier sheet. The stepwise progression may require the user to indicate on the user interface when each segment has been placed, such that the software operating the mounting unit then advances to the next segment in the queue for placement.

Although most beneficial for use in a manual process in which the image viewed by an operator when placing the printing plate segments helps guide the user, image 412 may still be useful in an automatic process for placing the printing plate segments, as the image can be used for verifying the correct segment and orientation of the segment have been automatically selected and properly placed.

Computer instructions corresponding to the mounting method steps described herein may include code that permits the user, or the software automatically, to identify (such as with the index number and/or image) a selected plate segment to be mounted. The code instructs the positioning mechanism to position the cameras relative to the base at the programmable coordinates corresponding to the predetermined location and orientation of the selected segment. The corresponding printing plate segment is selected (by the user for a manual process, or by a plate segment placement mechanism in an automatic embodiment) and aligned using the cameras. The user interface receives a signal that the selected plate segment has been placed (such as by the user selecting a button indicating the placement step has been completed), and then the foregoing steps are repeated for one or more additional selected plate segments until all have been placed.

Thus, a very basic embodiment of the invention comprises a computer-implemented method for mounting a plurality of printing plate segments on a carrier sheet in a predetermined arrangement of segment locations and orientations. This method comprises, using a computer processor associated with a mounting unit, importing the mounting file as described herein, and pursuant to step 541 of the workflow, displaying on a display connected to the computer processor, a composite image 412 depicting the image data corresponding to the characteristic pattern associated with each plate segment in the predetermined arrangement of segment locations and orientations, such as is illustrated in FIG. 4. The method may then comprise step 542 of mounting the plate segments onto the carrier sheet. The mounting step may comprise identifying, with the computer, a plate segment to be mounted, then instructing, with the computer, the mounting unit to assume a configuration for receiving the plate segment on the carrier sheet; and then placing the plate segment on the carrier sheet in its predetermined location and orientation. The foregoing steps are then repeated for one or more additional plate segments until all of the segments have been placed.

Another embodiment of the invention comprises a computer readable medium carrying computer readable code segments to instruct one or more processors to carry out a method for mounting a plurality of printing plate segments on a carrier sheet as described herein. Such code, at a minimum, may comprise one or more code segments for carrying out the steps found in the mounting portion 540 of workflow 500. Specifically, the code may comprise one or more code segments for instructing the one or more processors to read a mounting file as described herein, and one or more code segments for instructing the one or more processors to cause a display connected to the one or more processors to display a composite image 412 depicting the image data corresponding to the characteristic pattern associated with each printing plate segment in the predetermined printing arrangement of printing plate segment locations and orientations, as described herein.

The code may comprise code for operating a mounting module within a larger collection of code for administering additional steps of workflow 500. Thus, additional code segments corresponding to other stages of workflow 500 may also be included in a single software application, or in a suite of software application modules. For example, one collection of code segments may be for reading and displaying a single image file having image portions corresponding to the predetermined printing arrangement of printing plate segment locations and orientations, and parsing the single image file into a plurality of image subfiles, as described with respect to step 512 herein. Such code may comprise additional segments for adding indicia pursuant to step 514 and for arranging the subfiles into a printing plate composite layout for creating the plurality of printing plate segments, pursuant to step 516 as described herein. Another section of code may create the cut file readable by a cutting machine and mounting file readable by a mounting machine, as described herein. Still other sections of code may comprise one or more code segments for operating a cutting machine to perform the cutting steps of the workflow, namely for creating a file for cutting a printing plate having the printing plate composite layout into the plurality of printing plate segments.

Exemplary printing systems may comprise a mounting unit as described herein having a computer processor connected to a controller. Such systems may further comprise a layout processor 518 for conducting the layout portion of the workflow, an imagesetter or other apparatus connected to processor 528 for creating a printing plate in the printing plate generation portion 520 of the workflow, a cutting table connected to processor 538 for cutting the plate segments from the printing plate as described herein, and a printing system as is known in the art for conducting the step 552 of inking the printing plate and printing the desired image on a medium in the printing portion 550 of the workflow to create a finished print. Exemplary systems may include any combination or permutation of workstation portions.

Although such systems are ideally integrated by use of a single software package that can be used for each portion of the workflow, some systems may have need for only certain modules of the software corresponding to discrete portions of the workflow. Thus the invention is not limited to software or systems for performing the full workflow or to any specific combinations or permutations of workflow portions or code operative for certain workflow portions. Rather, one aspect of the invention at its core, comprises any apparatus, system, code residing on a computer readable medium, or computer implemented method for creating the display depicted in FIG. 4 in accordance with a mounting operation or in a mounting machine. Other aspects of the invention may comprise the integration of that portion of the method, system or code with portions of the workflow and systems and machines operative to perform those portions.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A mounting unit for mounting a plurality of printing plate segments on a single carrier sheet in a predetermined arrangement of printing plate segment locations and orientations, each printing plate segment having a printing plate segment identifier, at least two registration marks spaced a distance apart from one another, and a characteristic pattern configured to print on a medium using the printing plate segment, the mounting unit comprising:

a base for receiving the carrier sheet;

at least two cameras;

a camera positioning controller for positioning the at least two cameras relative to the base in accordance with a set of programmable coordinates;

a computer connected to the camera positioning controller and the at least two cameras, the computer comprising at least a computer memory and a computer processor, and configured to receive a mounting file comprising computer-readable information comprising, for each printing plate segment: (i) the printing plate segment identifier, (ii) information regarding alignment of the two registration marks relative to the carrier sheet; and (iii) image data corresponding to the characteristic pattern associated with each printing plate segment; and at least one display connected to the computer;

the computer programmed with instructions for carrying out the steps of:

(a) reading the mounting file;

(b) displaying on the at least one display, using information read from the mounting file, a composite image depicting the image data corresponding to the characteristic pattern and corresponding orientation associated with each printing plate segment in the predetermined arrangement of printing plate segment locations and orientations in which the plurality of printing plate segments are to be mounted on the single carrier sheet, and (c) instructing the camera positioning controller to position the at least two cameras relative to the base at respective programmable coordinates corresponding to each printing plate segment location and orientation in a stepwise manner until each of the plurality of printing plate segments has been placed at the respective programmable coordinates corresponding to each printing plate segment location and orientation.

2. The mounting unit of claim 1, wherein the base for receiving the carrier sheet is a moveable base, the camera positioning controller includes a base positioning mechanism for positioning the moveable base, and the one or more positioning mechanisms includes respective positioning mechanisms for positioning each of the at least two cameras and for positioning the moveable base.

3. The mounting unit of claim 2, wherein the moveable base comprises a rotary drum.

4. The mounting unit of claim 2, wherein the moveable base comprises a moveable table.

5. The mounting unit of claim 1, wherein the base comprises a flat table.

6. The mounting unit of claim 5, wherein the at least two cameras are positioned on a carriage.

7. The mounting unit of claim 6, wherein the carriage is configured to move relative to the flat table along a first axis, and the cameras are configured to move relative to the carriage along a second axis perpendicular to the first axis.

8. A mounting unit for mounting one or more printing plate segments on a carrier sheet in a predetermined arrangement of one or more printing plate segment locations and orientations, each printing plate segment having a printing plate segment identifier, at least two registration marks spaced a distance apart from one another, and a characteristic pattern configured to print on a medium using the printing plate segment, the mounting unit comprising:

a base for receiving the carrier sheet;
at least two cameras;
a camera positioning controller for positioning the at least two cameras relative to the base in accordance with a set of programmable coordinates;
a computer connected to the camera positioning controller and the at least two cameras, the computer comprising at least a computer memory and a computer processor, and configured to receive a mounting file comprising computer-readable information comprising, for each printing plate segment: (i) the printing plate segment identifier, (ii) information regarding alignment of the two registration marks relative to the carrier sheet; and (iii) image data corresponding to the characteristic pattern associated with each printing plate segment; and
at least one display connected to the computer;
the computer programmed with instructions for carrying out the steps of:
(a) reading the mounting file;
(b) displaying on the at least one display a composite image depicting the image data corresponding to each characteristic pattern associated with the one or more printing plate segments in the predetermined arrangement of one or more printing plate segment locations and orientations, and
(c) instructing the camera positioning controller to position the cameras relative to the base at respective programmable coordinates corresponding to each printing plate segment location and orientation in a stepwise manner until each of the one more printing plate segments has been placed at the respective programmable coordinates corresponding to each printing plate segment location and orientation, wherein the instructions include:

(c1) identifying a selected printing plate segment to be mounted;

(c2) instructing the camera positioning controller to position the cameras relative to the base at the programmable coordinates corresponding to the selected printing plate segment location;

(c3) receiving a signal from a user interface that the selected printing plate segment has been placed;

(c4) repeating steps (c1)-(c3) for one or more additional selected printing plate segments.

9. The mounting unit of claim 8, wherein the one or more printing plate segments includes at least two printing plate segments.

10. A printing system for printing an image, the image comprising one or more image portions arranged in a predetermined arrangement of one or more image portion locations and orientations, the system comprising:

a layout computer processor programmed with instructions for:
a) reading and displaying a single image file comprising the one or more image portions arranged in the predetermined arrangement of one or more image portion locations and orientations;
b) parsing the single image file into one or more image subfiles corresponding to one or more printing plate segments, each subfile corresponding to one image portion;
c) adding indicia, including a printing plate segment identifier and at least two registration marks, to each image subfile;
d) rearranging the one or more image subfiles into a printing plate composite layout, the printing plate composite layout comprising at least one location or orientation of at least one image portion that is different from the location or orientation of the at least one image portion in the predetermined arrangement of one or more image portion locations and orientations;
e) creating a cut file readable by a cutting machine, the cut file comprising information readable by a processor associated with the cutting machine to identify a location of each printing plate segment on a printing plate and cut along a path operable to separate each of printing plate segment from a remainder of the printing plate;
f) creating a mounting file readable by a mounting machine, the mounting file comprising information readable by a processor associated with the mounting machine, the information comprising for each printing plate segment: (i) the segment identifier, (ii) information regarding alignment of the two registration marks relative to a carrier sheet; and (iii) image data corresponding to the image portion and to a characteristic pattern associated with the printing plate segment;

a cutting machine, connected to a cutting machine computer processor, the cutting machine computer processor programmed with instructions to read the cut file and translate information in the cut file into instructions for commanding the cutting machine to cut the one or more printing plate segments from a printing plate having the printing plate composite layout;

a mounting unit for mounting the one or more printing plate segments on the carrier sheet in a predetermined arrangement of one or more printing plate segment locations and orientations corresponding to the predetermined arrangement of one or more image portion locations and orientations, the mounting unit comprising a base for receiving the carrier sheet, at least two cameras, a camera positioning controller for positioning the at least two cameras relative to the base in accordance with a set of programmable coordinates, and a mounting machine computer processor connected to the controller and the at least two cameras, the mounting machine computer processor programmed with instructions configured to receive the mounting file; and at least one display connected to the mounting machine computer processor, the mounting machine computer processor programmed with instructions for carrying out the steps of:

g) reading the mounting file;

h) displaying on the at least one display a composite image depicting the image data corresponding to the characteristic pattern associated with each plate segment in the predetermined arrangement of one or more printing plate segment locations and orientations, and i) instructing the camera positioning controller to position the cameras relative to the base at respective programmable coordinates corresponding to each printing plate segment location and orientation in a stepwise manner until each of the one or more printing plate segments has been placed at the respective programmable coordinates corresponding to each printing plate segment location and orientation.

11. The printing system of claim 10, wherein the mounting unit base for receiving the carrier sheet is moveable, and the camera positioning controller includes respective positioning mechanisms for positioning each of the at least two cameras and for positioning the moveable base.

12. The printing system of claim 11, wherein the image comprises at least two image portions corresponding to at least two image subfiles and at least two printing plate segments.

* * * * *